(12) United States Patent
Povey et al.

(10) Patent No.: US 12,319,158 B2
(45) Date of Patent: Jun. 3, 2025

(54) BATTERY CONDITION DETERMINATION

(71) Applicant: DUKOSI LIMITED, Edinburgh (GB)

(72) Inventors: Gordon Povey, Penicuik (GB); Joel Sylvester, Penicuik (GB)

(73) Assignee: DUKOSI LIMITED, Edinburgh (GB)

( * ) Notice: Subject to any disclaimer, the term of this patent is extended or adjusted under 35 U.S.C. 154(b) by 65 days.

(21) Appl. No.: 17/543,327

(22) Filed: Dec. 6, 2021

(65) Prior Publication Data

US 2022/0089045 A1 Mar. 24, 2022

Related U.S. Application Data

(63) Continuation of application No. 16/592,034, filed on Oct. 3, 2019, now Pat. No. 11,192,461, which is a
(Continued)

(30) Foreign Application Priority Data

May 2, 2014 (GB) ...................... 1407805

(51) Int. Cl.
*B60L 53/14* (2019.01)
*B60L 50/72* (2019.01)
(Continued)

(52) U.S. Cl.
CPC .............. *B60L 53/14* (2019.02); *B60L 50/72* (2019.02); *B60L 53/20* (2019.02); *B60L 58/12* (2019.02);
(Continued)

(58) Field of Classification Search
CPC . Y02T 10/7005; Y02T 10/7061; Y02T 90/32; H01M 8/04649; H01M 8/04537;
(Continued)

(56) References Cited

U.S. PATENT DOCUMENTS 6,084,523 A 7/2000 Gelnovatch et al.
6,184,656 B1 2/2001 Karunasiri et al.
(Continued)

FOREIGN PATENT DOCUMENTS

CN 1163020 A 10/1997
CN 102386448 A 3/2012
(Continued)

OTHER PUBLICATIONS

The extended European search report issued pursuant to Rule 62 EPC, the European search report (R. 61 EPC) or the partial European search report/declaration of no search (R. 63 EPC) and the European search opinion, in related EP Application No. 20210143. 2, mailed Jun. 28, 2021 (9 pgs.).
(Continued)

*Primary Examiner* — Anthony R Jimenez
(74) *Attorney, Agent, or Firm* — FINNEGAN, HENDERSON, FARABOW, GARRETT & DUNNER, LLP

(57) ABSTRACT

An energy conversion arrangement configured to convert chemical energy into electrical energy. The energy conversion arrangement comprises plural cell groups 30, 32, 34, 36, each cell group being configured to convert chemical energy into electrical energy. The energy conversion arrangement also comprises at least one measurement arrangement 38, 40, 42, 44, 46 configured to make measurements at each of the plural cell groups 30, 32, 34, 36. Each energy conversion arrangement is configured to determine a condition of at least one of: each of the plural cell groups; and the energy conversion arrangement. The condition is determined in dependence on the measurements made at each cell group and a model of each cell group.

20 Claims, 4 Drawing Sheets

Related U.S. Application Data continuation of application No. 15/308,092, filed as application No. PCT/GB2015/051308 on May 5, 2015, now Pat. No. 10,446,879.

(51) Int. Cl.

| | | |
|---|---|---|
| *B60L 53/20* | (2019.01) | |
| *B60L 58/12* | (2019.01) | |
| *B60L 58/22* | (2019.01) | |
| *G01R 31/00* | (2006.01) | |
| *G01R 31/367* | (2019.01) | |
| *G01R 31/396* | (2019.01) | |
| *H01M 8/04537* | (2016.01) | |
| *H01M 10/42* | (2006.01) | |
| *H01M 10/48* | (2006.01) | |

(52) U.S. Cl.
CPC ............ *B60L 58/22* (2019.02); *G01R 31/007* (2013.01); *G01R 31/367* (2019.01); *G01R 31/396* (2019.01); *H01M 8/04649* (2013.01); *H01M 10/4207* (2013.01); *H01M 10/4257* (2013.01); *H01M 10/482* (2013.01); *H01M 2010/4271* (2013.01); *H01M 2010/4278* (2013.01); *H01M 2220/20* (2013.01); *H01M 2250/20* (2013.01); *Y02T 10/70* (2013.01); *Y02T 90/40* (2013.01)

(58) Field of Classification Search
CPC ......... H01M 8/04544; H01M 8/04552; H01M 8/04604; H01M 8/04574; H01M 8/04694; H01M 8/04701; H01M 8/04858; H01M 8/04865; H01M 8/04925; H01M 8/04949; H01M 8/04951; H01M 8/04952; H01M 2010/4271; H01M 2010/4278; H01M 2220/20; H01M 2250/20; H01M 2250/4207; H01M 2250/482; H01M 10/4257; H01M 10/48; H01M 10/482; H01M 10/484; H01M 10/486; H01M 10/63; H01M 10/651; G01R 31/007; G01R 31/3651; G01R 31/3658; G01R 31/00; G01R 31/367; G01R 31/396; B60L 11/1811; B60L 11/1861; B60L 11/1866; B60L 11/1883; B60L 11/1816; B60L 53/20; B60L 53/14; B60L 58/12; B60L 58/22; B60L 50/72

See application file for complete search history.

(56) References Cited

U.S. PATENT DOCUMENTS

| | | | |
|---|---|---|---|
| 6,456,046 B1 | 9/2002 | Gaza | |
| 6,809,649 B1 | 10/2004 | Wendelrup et al. | |
| 8,299,757 B2* | 10/2012 | Yamauchi | H01M 10/482 |
| | | | 320/132 |
| 9,269,992 B2 | 2/2016 | Okamura et al. | |
| 9,293,935 B2 | 3/2016 | Lee et al. | |
| 9,316,694 B2 | 4/2016 | Campbell et al. | |
| 9,413,042 B2 | 8/2016 | Golubkov | |
| 9,437,850 B2 | 9/2016 | Brockman et al. | |
| 9,531,001 B2 | 12/2016 | Kozinsky et al. | |
| 9,564,762 B2 | 2/2017 | Lee et al. | |
| 9,581,654 B2 | 2/2017 | Campbell et al. | |
| 9,608,297 B2 | 3/2017 | van Lammeren et al. | |
| 9,620,987 B2 | 4/2017 | Alexander et al. | |
| 9,669,723 B2 | 6/2017 | Sugeno et al. | |
| 9,733,310 B2 | 8/2017 | Thoelmann | |
| 9,766,293 B2 | 9/2017 | Sims et al. | |
| 9,797,784 B2 | 10/2017 | Patel et al. | |
| 9,851,412 B2 | 12/2017 | Haag et al. | |
| 9,970,989 B2 | 5/2018 | Nakamura et al. | |
| 10,222,425 B2 | 3/2019 | Nagato et al. | |
| 10,518,648 B2 | 12/2019 | Muzaffer | |
| 10,870,360 B2 | 12/2020 | Campbell et al. | |
| 2002/0001745 A1 | 1/2002 | Gartstein et al. | |
| 2005/0151657 A1 | 7/2005 | Lockhart et al. | |
| 2005/0162172 A1 | 7/2005 | Bertness | |
| 2006/0152190 A1 | 7/2006 | Riemschneider | |
| 2008/0233471 A1 | 9/2008 | Aumayer et al. | |
| 2009/0295397 A1 | 12/2009 | Barsukov | |
| 2010/0045239 A1 | 2/2010 | Oki | |
| 2010/0174500 A1 | 7/2010 | Plett | |
| 2010/0194576 A1* | 8/2010 | Bertness | G01R 31/385 |
| | | | 324/426 |
| 2011/0115425 A1* | 5/2011 | Olsson | B60L 8/003 |
| | | | 320/109 |
| 2011/0187378 A1 | 8/2011 | Boehm et al. | |
| 2012/0116699 A1 | 5/2012 | Haag et al. | |
| 2012/0119746 A1* | 5/2012 | Macris | H02J 7/0048 |
| | | | 324/431 |
| 2012/0256592 A1 | 10/2012 | Baughman | |
| 2012/0274331 A1 | 11/2012 | Liu et al. | |
| 2013/0229156 A1 | 9/2013 | Brandon et al. | |
| 2013/0260188 A1* | 10/2013 | Coates | H01M 10/42 |
| 2013/0311116 A1 | 11/2013 | Chaturvedi et al. | |
| 2013/0332370 A1 | 12/2013 | Hyde et al. | |
| 2014/0350877 A1 | 11/2014 | Chow et al. | |
| 2017/0279140 A1 | 9/2017 | Choudhury | |

FOREIGN PATENT DOCUMENTS

| | | |
|---|---|---|
| CN | 102736031 A | 10/2012 |
| CN | 219676226 U | 9/2023 |
| CN | 117317412 A | 12/2023 |
| CN | 220298339 U | 1/2024 |
| DE | 102009046964 A1 | 5/2011 |
| DE | 102013012652 A1 | 2/2014 |
| DE | 102013021469 A1 | 8/2014 |
| DE | 102014222440 A1 | 5/2016 |
| EP | 2426755 A2 | 3/2012 |
| EP | 2720054 A1 | 4/2014 |
| FR | 3032832 A1 | 8/2016 |
| KR | 101628216 B1 | 6/2016 |
| TW | 201317787 A | 5/2013 |
| WO | WO 98/22830 | 5/1998 |
| WO | 2003/047064 A2 | 6/2003 |
| WO | 2004/047215 A1 | 6/2004 |
| WO | WO 2005/003800 A1 | 1/2005 |
| WO | 2005/078673 A1 | 8/2005 |
| WO | 2014/103003 A1 | 7/2014 |
| WO | 2016/112718 A1 | 7/2016 |

OTHER PUBLICATIONS

Brief Communication regarding Oral Proceedings issued in related European Application No. 15725400.4, mailed on Nov. 16, 2020 (6 pgs.).

International Search Report and Written Opinion issued by the International Searching Authority in related PCT Application No. PCT/GB2015/051308, mailed Aug. 5, 2015 (8 pgs.).

First Search Report issued in related Chinese Application No. CN 201580026850, mailed Jul. 23, 2018.

Supplemental Search Report issued in related Chinese Application No. CN 201580026850, mailed Apr. 16, 2019.

The First Office Action issued by the Chinese Patent Office in related Patent Application No. CN 201580026850, mailed Jul. 31, 2018 (10 pgs.).

The Second Office Action issued by the Chinese Patent Office in related Patent Application No. CN 201580026850, mailed Apr. 25, 2019 (12 pgs.).

First Communication pursuant to Art. 94(3) EPC issued in related European Application No. 15725400.4, mailed Nov. 24, 2017 (5 pgs).

Second Communication pursuant to Art. 94(3) EPC issued in related European Application No. 15725400.4, mailed Oct. 17, 2018 (4 pgs).

(56) References Cited

OTHER PUBLICATIONS

Summons to attend oral proceedings pursuant to Rule 115(1) EPC issued in related European Application No. 15725400.4, mailed Jul. 2, 2020 (6 pgs).

T. L. Churchill, J. S. Edmonds and C. T. Feyk, "Comprehensive noninvasive battery monitoring of lead-acid storage cells in unattended locations," Proceedings of Intelec 94, Vancouver, BC, Canada, 1994, pp. 594-601, doi: 10.1109/INTLEC.1994.396591 (1994).

MPower Solutions Ltd, "Battery Management Systems" (Jul. 29, 2004), available at https://web.archive.org/web/20040729060054/https:/www.mpoweruk.com/bms.htm.

Maxim Integrated Products, Application Note 131: "Lithium-Ion Cell Fuel Gauging with Maxim Battery Monitor ICs" (Mar. 29, 2001).

\* cited by examiner

BATTERY CONDITION DETERMINATION

This application is a continuation of U.S. patent application Ser. No. 16/592,034 filed on Oct. 3, 2019 and issued as U.S. Pat. No. 11,192,461 on Dec. 7, 2021, which is a continuation of U.S. patent application Ser. No. 15/308,092 filed on Oct. 31, 2016 and issued as U.S. Pat. No. 10,446,879 on Oct. 15, 2019, which is a 371 of International Application No. PCT/GB2015/051308, filed on May 5, 2015, which claims the priority of Great Britain Application No. 1407805.9, filed on May 2, 2014, all of which are incorporated herein by reference.

FIELD OF THE INVENTION

The present invention relates to an energy conversion arrangement, such as an electric battery, which is configured to convert chemical energy into electrical energy and to determine a condition of the energy conversion arrangement. The present invention also relates to a method of determining a condition of an energy conversion arrangement which is configured to convert chemical energy into electrical energy. The present invention further relates to a condition determining arrangement configured to determine a condition of an energy conversion arrangement.

BACKGROUND ART

Lithium-ion battery cells have seen widespread use in small consumer devices such as laptop computers and mobile telephones. Lithium-ion batteries have recently begun to supplant conventional batteries in applications having greater electrical energy demands, such as electrical vehicles and static electricity generation apparatus. Lithium-ion batteries are seeing increased use on account of their normally superior performance over conventional batteries, such as lead-acid and NiMH batteries, in particular in respect of energy storage density and power density. To meet electrical energy demand in such larger energy demand applications a battery is typically comprised of plural lithium-ion battery cells which are arranged in at least one of series and parallel depending on current and voltage requirements.

Lithium-ion batteries can be dangerous under certain conditions on account of their containing a flammable electrolyte. Safe and effective use of a lithium-ion battery normally requires operation of the battery within its Safe Operating Area (SOA). Considering operation within a SOA further, most lithium-ion cells are damaged if discharged below a certain voltage and their lifetime is reduced if discharged at too high a current or if charged too quickly. Furthermore lithium-ion cells may be damaged if they are overcharged above a certain voltage or if they exceed a certain temperature and may burst into flames if further overcharged. In addition there is often the lesser constraint of a Normal Operating Area (NOA). Breaching the NOA results in reduction in capacity or cell life over time. These challenges are compounded by the multi-cell configuration of the typical lithium-ion battery wherein unevenness of charge and discharge can arise between cells. Careful management by way of a battery management system (BMS) is therefore normally required to provide for safe and effective operation.

Battery management systems for lithium-ion battery arrangements are known. Such a battery management system typically makes measurements of properties, such as current, voltage and temperature, in a battery and makes determinations concerning safe and effective operation based on the measurements. The determinations are often made in dependence on an analytical model of the battery.

The present inventors have become appreciative of shortcomings in known approaches to management of lithium-ion battery arrangements. The present invention has been devised in the light of the inventors' appreciation of such shortcomings. It is therefore an object for the present invention to provide an improved energy conversion arrangement comprising plural cells which are each configured to convert chemical energy into electrical energy, the energy conversion arrangement being configured to determine a condition of the plural cells. It is a further object for the present invention to provide an improved method of determining a condition of an energy conversion arrangement comprising plural cells. It is a yet further object for the present invention to provide an improved condition determining arrangement configured to determine a condition of an energy conversion arrangement comprising plural cells.

STATEMENT OF INVENTION

According to a first aspect of the present invention there is provided an energy conversion arrangement, such as an electric battery, configured to convert chemical energy into electrical energy, the energy conversion arrangement comprising:
  plural cell groups comprised in the energy conversion arrangement, each cell group being configured to convert chemical energy into electrical energy; and
  at least one measurement arrangement configured to make measurements at each of the plural cell groups,
  the energy conversion arrangement being configured to determine a condition of at least one of: each of the plural cell groups; and the energy conversion arrangement, in dependence on the measurements made at each cell group and a model of each cell group.

An energy conversion arrangement according to the present invention, such as an electric battery, comprises plural cell groups which are each configured to convert chemical energy into electrical energy whereby the energy conversion arrangement may provide electrical energy from all of the plural cell groups. In the energy conversion arrangement at least one measurement arrangement is configured to make measurements at each of the plural cell groups. The measurements may, for example, comprise voltage, current, temperature and pressure. Separate measurements are therefore made for each of the plural cell groups. The energy conversion arrangement is configured to determine at least one condition, such as State of Charge (SOC), State of Health (SOH), Depth of Discharge (DOD), capacity, internal resistance and internal impedance, of each of the plural cell groups. The condition may thus comprise derived data, i.e. data derived from measurement of electrical and/or physical properties by the at least one measurement arrangement. Derived data may correspond to a property which is not susceptible to direct measurement. The derived data may comprise at least one derived electrical property, such as internal resistance or internal impedance. Alternatively or in addition the derived data may comprise condition data representing an operational condition of at least one of a cell group and the energy conversion arrangement, such as SOC, SOH or DOD. The condition of at least one of: each of the plural cell groups; and the energy conversion arrangement is determined in dependence on the measurements made at each cell group and a model of each cell group. In a distributed arrangement, as described further below, the condition of each cell group may be determined in dependence on the measurements made at the cell group and a model of the cell group. The energy conversion arrangement may therefore be operative to determine a separate condition for each cell group.

A cell group model may be determined in dependence on measurements made on a cell group, such as during initial tests. The cell group model may therefore be a numerical model in contrast with known analytical models albeit battery level models. Where the energy conversion arrangement comprises an electric battery, the cell group model may be based on measurements sufficient to characterise a SOC versus Open Circuit Voltage (OCV) curve for the electric battery. Each cell group model may be stored at the cell group. Typically and as described further below measurement apparatus and analogue-to-digital conversion apparatus also may be located at the cell group in view of the convenience of using a digital cell group model as opposed to an analogue cell group model. According to one approach, the same cell group model may be used for each cell group. According to another approach, a different cell group model may be used for each cell group. More specifically each cell group model may be configured for the cell group with which it operates, such as in dependence on measurements made at the cell group during initial testing/calibration. Nevertheless the cell group model may be of a same structure.

The energy conversion arrangement may be further configured to determine a condition of the energy conversion arrangement per se in dependence on the plural cell group conditions. The overall condition may therefore depend on the determined condition of all the separately determined cell group conditions. For example and where the energy conversion arrangement comprises an electric battery an overall SOC and an overall depth of discharge for the battery may be determined. Furthermore a better informed decision may be made in respect of an operation on the energy conversion arrangement, such as when to perform charge balancing. The energy conversion arrangement may comprise an energy conversion arrangement model which, in use, receives the plural cell group conditions and provides energy conversion arrangement data in dependence thereon. The condition of the energy conversion arrangement per se may be determined in dependence on the energy conversion arrangement data. According to one approach, the energy conversion arrangement model may be stored at one location, such as at one of the cell groups. According to another approach, there may be at least one copy of the energy conversion arrangement model which is stored at a different location such as at another one of the cell groups. For example there may be as many copies of the energy conversion arrangement model as there are cell groups with a copy being stored at each of the cell groups. Having at least one copy of the energy conversion arrangement model stored as described above may reduce the amount of data that is required to be communicated within the energy conversion arrangement.

As mentioned above, charge balancing may be an important function for an energy conversion arrangement, such as an electric battery. Known approaches to charge balancing are described in *Battery Management Systems for Large Lithium-ion Battery Packs*, Davide Andrea, 2010, published by Artech House, Norwood MA 02062, USA. As described elsewhere herein the energy conversion arrangement according to the present invention may be configured such that each cell group determines its own SOC. Furthermore each cell group receives, amongst other things, SOC data for other cell groups comprised in the energy conversion arrangement whereby an SOC for the energy conversion arrangement may be determined. The energy conversion arrangement may be configured such that each cell group is operative to determine whether or not the cell group should perform passive charge balancing in dependence on the cell group's own SOC and the SOC for the energy conversion arrangement. Thus each cell group in the energy conversion arrangement makes a determination in respect of charge balancing either independently of the other cell groups or in cooperation with the other cell groups. Nevertheless the energy conversion arrangement may be configured such that determinations in respect charge balancing are made on a distributed basis and without dependence on a central controller. Indeed and as described elsewhere herein the energy conversion arrangement may lack any central controller. A central controller is characteristic of known centrally controlled energy conversion arrangements which contrast with the distributed approach of the present invention. The energy conversion arrangement of the present invention may be configured to perform charge balancing in dependence on a determination made by a cell group. The energy conversion arrangement may therefore comprise charge balancing apparatus. The form and function of appropriate charge balancing apparatus is described in *Battery Management Systems for Large Lithium-ion Battery Packs*.

Alternatively or in addition the energy conversion arrangement may be configured for active charge balancing.

Known battery management systems rely on a battery model whereas the present invention relies on a cell group model. Management according to the present invention can therefore take the characteristics of individual cell groups into consideration, for example, to monitor individual cell groups over time. Monitoring individual cell groups over time enables determination of the like of a rate of reduction of state of health of a particular cell group that is greater than a rate of reduction of state of health of another cell group. A weak or exhausted cell group may therefore be identified with greater ease prior to its replacement in preference to more involved investigation to determine the weak or exhausted cell group or replacement of all the cells groups where only one cell group might need replacing.

Furthermore monitoring individual cell groups over time may upon analysis yield information of assistance in addressing a warranty issue or detecting performance that is progressing towards a potentially dangerous condition such as a thermal event, for example, a fire. In addition monitoring individual cell groups may provide for the generation of alarm data when a determined condition passes a threshold, such as when a SOC drops below a predetermined value. The energy conversion arrangement may therefore be operative to store, for example in non-volatile memory, a plurality of conditions determined at spaced apart times. Condition data stored at one time may comprise at least one of: number of complete charge/discharge cycles; total coulomb transfer; temperature, such as maximum and minimum temperature; SOC; SOH; DOD; and capacity, More fundamental condition data may also be stored such as at least one of voltage, current, resistance and impedance. Condition data stored at any one time may comprise a time stamp.

Where determination and storage of cell group condition is at each cell group, as described further below, monitoring over time may provide for storage of condition data even if the energy conversion arrangement is incompletely assembled or if an energy conversion arrangement management system, such as a BMS, is powered down.

The energy conversion arrangement may be further operative to analyse the stored plurality of conditions, for example, to determine the like of a trend. Alternatively or in addition, analysis may be performed other than in the energy conversion arrangement. The energy conversion arrangement may therefore be configured, such as by way of a communications port, to provide for the stored plurality of conditions to be conveyed away from the energy conversion arrangement to further apparatus, such as computing apparatus comprised in the like of a battery charging station or in a remote server, for analysis in and reporting by the further apparatus.

Storage of a plurality of conditions determined at spaced apart times may provide for ease of use of the energy conversion arrangement in a second application after its initial application. For example, initial use in BEVs may require operation of an electric battery at over 80% of original capacity whereas operation of the battery at over 50% of original capacity may be sufficient for a second use such as in off-grid storage subject to the service history as reflected by the stored conditions being at least satisfactory. The energy conversion arrangement may therefore be operative to determine electrical energy delivery capacity, such as storage capacity when the energy conversion arrangement is a battery. The energy conversion arrangement may be further operative to compare the electrical energy delivery capacity with a predetermined value and perhaps also to determine if the energy conversion arrangement should be subject to second use. Alternatively or in addition the energy conversion arrangement may be operative to determine whether or not a service history is at least satisfactory in dependence on the stored plurality of conditions and perhaps also to determine if the energy conversion arrangement should be subject to second use. Re-use of energy conversion arrangements as local storage in off-grid applications may be beneficial in smoothing variation in demand and supply and improving upon efficiency and in particular where there are plural energy sources which provide for fluctuation in supply, such as local wind, solar and CHP generation plant.

As mentioned above, lithium-ion battery cells can be dangerous under certain conditions on account of their containing a flammable electrolyte. Appropriate design is therefore required of lithium-ion battery cells to provide for their safe use. It is not unknown for an improperly designed or manufactured lithium-ion battery cell to be unwittingly brought into use with the nature of the improper design not being evident from ordinary inspection of the battery cell. Verification of properly designed lithium-ion battery cells may therefore be advantageous to mitigate risk, support product warranties and present a barrier to the introduction of counterfeit batteries. The model of each cell group may therefore further comprise an identification code which is unique to each cell group. Each cell group may thus be identifiable and susceptible to verification. Furthermore and where each cell group model comprises an identification code, each cell group may be readily identified and distinguished from the other cell groups within the energy conversion arrangement to thereby provide for ease of removal of a cell group from the energy conversion arrangement during a replacement procedure. The cell group model may further comprise a cryptographic signing component to thereby provide for cell group authentication and, where there is storage of a plurality of conditions determined at spaced apart times, for verification of stored condition data.

The value of lithium-ion battery cells is relatively high. Battery theft is therefore a risk. As mentioned above, the energy conversion arrangement may be configured, such as by way of a communications port, to provide for conveyance of data away from the energy conversion arrangement to the like of a battery charging station. Such communication may provide for tracing of a stolen battery by way of its unique identification code. The identification code may comprise a unique address. The identification code may be in a standard electronic communications format and perhaps an Internet protocol such as TCP protocol over IPv6, Use of a standard electronic communications format may provide for ease of communication of data between the energy conversion arrangement and the like of an Internet based database. Such an Internet based database may be operative to store data from a plurality of energy conversion arrangements over time with such stored data being of value to the like of cell and energy conversion arrangement manufacturers. A unique address may provide for addressing of individual cell groups within the energy conversion arrangement when the cell groups are comprised within a wider communications network such as may be provided when the energy conversion arrangement is in communication with the like of a battery charging station.

Management according to the present invention can take the characteristics of individual cell groups into consideration to provide for improved determination of state of charge (SOC). Improved determination of SOC may provide an improvement in operation vis-à-vis an SOA. Advantages include improved battery use, such as increased operating range before re-charge when the energy conversion arrangement is comprised in a battery electric vehicle or more reliable end of life determination.

The energy conversion arrangement may comprise a network and may be configured such that each of the plural cell groups is connected to the network. Communication over the network may be by way of an Internet protocol, such as TCP/IP. The network may comprise an isolated bus arrangement whereby the plural cell groups are of equal priority. As mentioned above, each cell group model may comprise an address whereby a cell group can be identified by way of its address instead of by its physical location. During assembly, cell groups of an energy conversion arrangement may therefore be installed in any order. Furthermore a cell group may be replaced without the need to reassign its location in the network. An isolated bus approach provides, in contrast with isolated node communications, for substantially constant communication latency between any two cell groups.

The energy conversion arrangement may comprise plural measurement arrangements with each measurement arrangement being configured to make measurements at a respective one of the plural cell groups. Each of the plural measurement arrangements may be located at a respective one of the plural cell groups. There may therefore be less communication within the energy conversion arrangement with attendant benefits such as reduction in susceptibility to interference where communication is by electrical wires. The energy conversion arrangement may further comprise analogue-to-digital conversion apparatus which is operative to receive analogue signals from the at least one measurement arrangement and provide corresponding digital signals. Where the energy conversion arrangement comprises plural measurement arrangements, there may be plural analogue-to-digital conversion apparatus with each analogue-to-digital conversion apparatus being operative to receive analogue signals from a respective measurement arrangement. Each analogue-to-digital conversion apparatus may be located with a measurement arrangement at a different cell group. Conversion to digital signals may therefore take place at the cell group. Having such a distributed architecture may reduce calibration and test overheads. For example BMS calibration and test may be performed at least in part at the same time as group cell test.

Each cell group may comprise plural cells, such as two or four electric battery cells. The energy conversion arrangement may typically comprise plural cells which may be arranged in parallel to form a block which provides increased current with plural cells or blocks being arranged in series to increase the voltage. A cell group may therefore be a block. A cell may be considered as the most basic element in the energy conversion arrangement that is capable of producing electrical energy in dependence on chemical energy. The plural cells in a cell group may therefore be treated as an entity with regard to measurement and a cell group model. Alternatively at least one cell group may comprise solely one cell. Measurements may therefore be made in respect of only one cell and the cell group model may be for one cell only.

The plural cell groups are comprised in an energy conversion arrangement which is configured to convert chemical energy into electrical energy. The energy conversion arrangement may comprise energy storage apparatus. The energy storage apparatus may comprise an electric battery and may thus be operative in dependence on stored chemical energy. The energy conversion arrangement may be operable to convert electrical energy into stored chemical energy. The electric battery may therefore be a secondary electric battery, i.e. a rechargeable electric battery. At least one cell may be an electrochemical cell which is operative to convert stored chemical energy into electrical energy and vice-versa. More specifically the at least one cell may be a lithium-ion (Li-ion) cell. Alternatively the energy conversion arrangement may be operative on chemical energy from received rather than stored matter. The energy conversion arrangement may therefore comprise a fuel cell arrangement. The fuel cell arrangement may be operative to convert received fuel, such as hydrogen, into electrical energy. At least one cell may be a fuel cell.

Measurements may comprise measurements of at least one of an electrical property and a physical property. Measurements may comprise: voltage; current; temperature; and pressure. The at least one measurement arrangement may be appropriately configured to measure the at least one electrical property and physical property.

Where the energy conversion arrangement comprises an electric battery, the energy conversion arrangement may be configured to determine how the electric battery is to be charged in dependence on at least one determined condition. More specifically the energy conversion arrangement may be configured to determine how the electric battery is to be charged having regards to SOA requirements to provide, for example, fast charging but without compromising the integrity or safety of the electric battery. The energy conversion arrangement may therefore comprise parameters relating to SOA requirements. A determination as to how the electric battery is charged may be in dependence on service history as reflected by a stored plurality of conditions, as describe elsewhere herein. An intended use of the energy conversion arrangement after charging may have a bearing on how the electric battery is charged. The energy conversion arrangement may therefore comprise an operator input which is user operable to input data relating to intended use and data storage and which is operative to store data input by the user. Where the energy conversion arrangement is to be used in a BEV, the user may, for example, input data relating to an intended distance to be travelled by the BEV. The energy conversion arrangement may be operative to determine how the electric battery is charged in dependence on the data input by the user. Different energy tariffs may apply at different times of the day. It may therefore be advantageous to control when the electric battery is charged. Control over when the electric battery is charged may be by way of the operator input described above. The energy conversion arrangement may further comprise charging apparatus which is configured to charge an electric battery comprised in the energy conversion arrangement. The charging apparatus may be controlled in dependence on operation of the energy conversion arrangement as described elsewhere herein.

As described elsewhere herein, each cell group may be operative per se in respect of management functions such as: measurement of the like of voltage, current and temperature: determination of various parameters such as SOC, DOD, SOH and internal resistance: and the recordal of events such as charge/discharge cycles, NOA and SOA excursions. Each cell group may be so operative irrespective of whether the energy conversion arrangement has yet to be assembled from the cell group and other cell groups, the energy conversion arrangement has been assembled or the energy conversion arrangement has been disassembled. Each cell group may therefore be configured to perform at least one management function. Alternatively or in addition, each cell group may be configured to perform at least one management function in cooperation with at least one other cell group.

According to a second aspect of the present invention there is provided an electric vehicle (EV) comprising an energy conversion arrangement according to the first aspect of the present invention. An electric vehicle (EV) may comprise an electric propulsion arrangement. The EV may either comprise an electric battery or lack an electric battery. More specifically the electric vehicle may be one of a fuel cell electric vehicle (FCEV), a Battery Electric Vehicle (BEV), a Hybrid Electric Vehicle (HEV) and a Plug-in Hybrid Electric Vehicles (PHEV). Where the electric vehicle comprises an electric battery, the electric vehicle may further comprise charging apparatus which is configured to charge the electric battery.

It is known for an electric vehicle to comprise a data recorder which is operative to record data relating to use of the electric vehicle. Often only relatively recent data is stored in the data recorder such as data relating to the most recent five seconds of use of the electric vehicle before an impact. The energy conversion arrangement may be configured either alone or in combination with the data recorder to provide for enhanced data recording. More specifically the energy conversion arrangement may be configured to record, in addition to cell group condition, measurements from at least one in-vehicle sensor, such as measurements relating to GPS location, speed and acceleration.

The energy conversion arrangement may be configured to analyse recorded data and to compare an outcome of the analysis with reference data. The reference data may, for example, be based on data recorded during at least one previous journey and the analysis may comprise comparing efficiency of energy use between a presently completed journey and the reference data. By way of further example, the reference data may be based on data collected from plural energy conversion arrangements which is received from a server operative to receive and store data recorded by plural energy conversion arrangements. A user of the energy conversion arrangement may thus be able to compare driving efficiency with the like of a mean standard established by a large number of other vehicles for a similar journey.

According to a third aspect of the present invention there is provided energy conversion arrangement management apparatus comprising plural energy conversion arrangements each according to the first aspect of the present invention and a server, each energy conversion arrangement and the server being configured to be in data communication with each other. More specifically the server may be configured to store energy conversion arrangement management data. The energy conversion arrangement management data may comprise data received from each of the plural energy conversion arrangements. The energy conversion arrangement management data may be of value to manufacturers and suppliers for the like of: dealing with warranty issues; authentication of cell groups; and evaluating product performance. Alternatively or in addition, an energy conversion arrangement may receive and be operative in dependence on energy conversion arrangement management data received from the server. For example, a user of the energy conversion arrangement may be advised of a need for servicing of the energy conversion arrangement or of appropriate journey planning in dependence on energy conversion arrangement management data received from the server.

According to a fourth aspect of the present invention there is provided a method of determining a condition of an energy conversion arrangement, such as an electric battery, configured to convert chemical energy into electrical energy and comprising plural cells which are each configured to convert chemical energy into electrical energy, the method comprising:
  making measurements at each of the plural cells; and
  determining a condition of at least one of: each of the plural cell groups; and the energy conversion arrangement, in dependence on measurements made at each cell and a model of each cell.

Embodiments of the fourth aspect of the present invention may comprise one or more features of any previous aspect of the present invention.

According to a fifth aspect of the present invention there is provided a condition determining arrangement comprising:
  at least one measurement arrangement configured to make measurements at each of plural cell groups comprised in an energy conversion arrangement, each of the plural cell groups being configured to convert chemical energy into electrical energy; and
  a computer program comprising program instructions for causing a computer, such as a microcontroller, to determine a condition of at least one of: each of the plural cell croups; and the energy conversion arrangement, in dependence on the measurements made at each cell group and a model of each cell group.

More specifically the computer program may be one of: embodied on a record medium; embodied in a read only memory; stored in a computer memory; and carried on an electrical carried signal. Further embodiments of the fifth aspect of the present invention may comprise one or more features of the first aspect of the present invention.

According to a further aspect of the present invention there is provided an energy conversion arrangement comprising: plural cell groups, each cell group being configured to convert chemical energy into electrical energy; and at least one measurement arrangement configured to make measurements at each of the plural cell groups, the energy conversion arrangement being configured to determine a condition of the energy conversion arrangement in dependence on the measurements made at each cell group. The energy conversion arrangement may be configured to determine a condition of at least one cell group in dependence on the measurements made at each cell group. Further embodiments of the further aspect of the present invention may comprise one or more features of any previous aspect of the present invention.

BRIEF DESCRIPTION OF DRAWINGS

Further features and advantages of the present invention will become apparent from the following specific description, which is given by way of example only and with reference to the accompanying drawings, in which.

DESCRIPTION OF EMBODIMENTS

Figure 1:
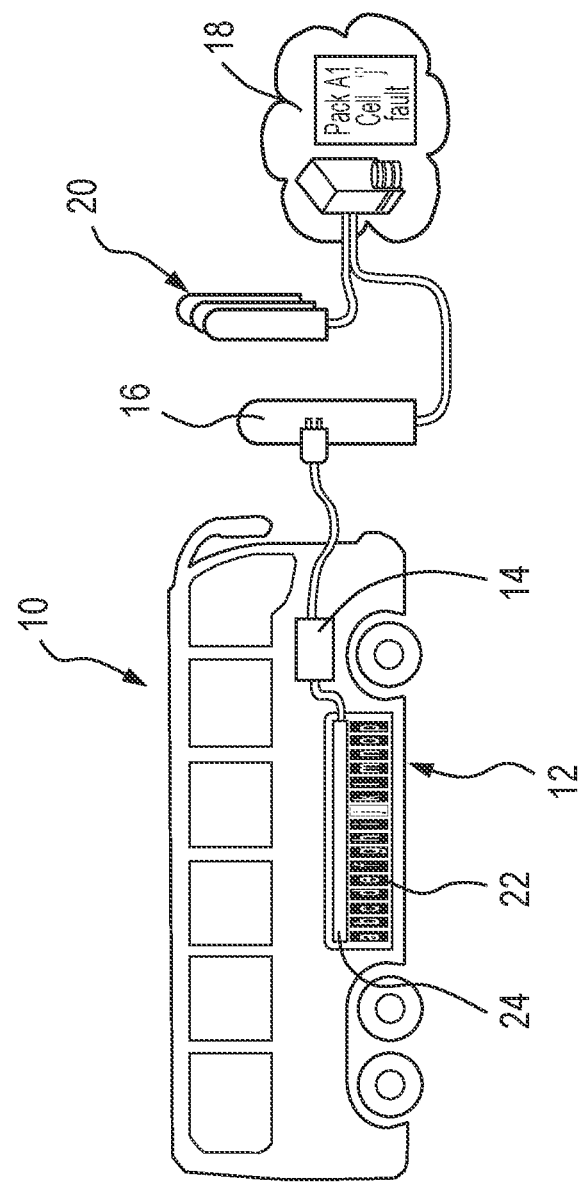
FIG. 1 shows an Electric Vehicle comprising an energy conversion arrangement according to the present invention during charging.

A Battery Electric Vehicle (BEV) 10 comprising an energy conversion arrangement 12 in the form of an electric battery according to the present invention is shown in FIG. 1 while the electric battery is being charged. As can be seen from FIG. 1, the BEV 10 further comprises charging apparatus 14 which is electrically coupled to the electric battery 2 and which is operative to control the charging of the electric battery. In accordance with known practice the charging apparatus 14 is electrically connected to a vehicle charging point 16. The vehicle charging point 16 is in communication with a remote server 18. Data is communicated between the vehicle charging point 16 and the server 18 as is described further below. Plural further vehicle charging points 20 are provided at respective different locations with each further vehicle charging point 20 also being in communication with the server 18 whereby data from each of the vehicle charging points 16, 20 is conveyed to, stored in and operated upon by the server 18. FIG. 1 shows an arrangement involving charging by way of a wired coupling between the charging point 16 and the energy conversion arrangement 12. According to an alternative approach charging is wireless by way of an inductive coupling between the charging point 16 and the energy conversion arrangement 12. The design of an inductively coupled wireless charging arrangement will be within the ordinary design capabilities of the person of ordinary skill in the art. As can be seen from FIG. 1, the electric battery 12 comprises sixteen blocks 22 of lithium-ion battery cells (which each constitute a cell group) which are connected in series. Each block 22 comprises plural lithium-ion battery cells which are connected in parallel. In an alternative form each block comprises solely one battery cell it being noted that the present invention is equally applicable when solely one battery cell is used instead of plural battery cells. The electric battery 12 further comprises a battery management arrangement 24 which is described further below with reference to FIGS. 2 to 4.

Figure 2:
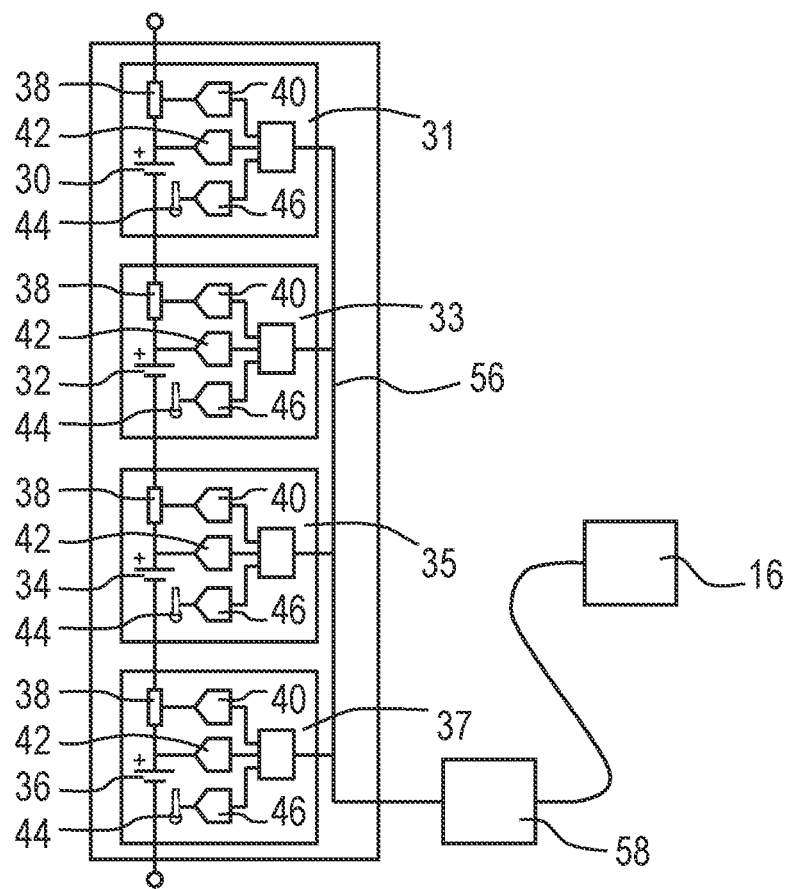
FIG. 2 is a block diagram representation of an energy conversion arrangement according to the present invention.

A block diagram representation of four series connected blocks of lithium-ion battery cells and associated circuitry (which together constitute an energy conversion arrangement) is shown in FIG. 2. The arrangement of FIG. 2 comprises first, second, third and fourth blocks of cells 30, 32, 34, 36. The arrangement of FIG. 2 further comprises first, second, third and fourth measurement and processing circuitry 31, 33, 35, 37 which are each at a respective one of the first, second, third and fourth blocks of cells 30, 32, 34, 36. The first, second, third and fourth measurement and processing circuitry 31, 33, 35, 37 are substantially the same as one another. One of the first, second, third and fourth measurement and processing circuitry 31, 33, 35, 37 is shown in more detail in FIG. 3. The measurement and processing circuitry of FIG. 3 comprises a low value resistor 38 in series with each block which is operative to sense the current drawn from the block and which forms part of a voltage divider arrangement (not shown) which is operative to convert the drawn current to a measurable voltage. Measurement is to 12 or 14 bit accuracy with the actual accuracy to which the current is determined being less than afforded by 12 or 14 bit measurement on account of the effect of self heating. A first analogue-to-digital converter 40 is operative to convert the voltage from the voltage divider arrangement to corresponding digital data. The measurement and processing circuitry of FIG. 3 also comprises a second analogue-to-digital converter 42 which is operative to convert the voltage across the block to corresponding digital data. The voltage across the block is measured to within 1 mV. The measurement and processing circuitry of FIG. 3 also comprises a temperature sensor 44 such as a silicon bandgap temperature sensor (or Proportional To Absolute Temperature [PTAT] sensor) comprised in an integrated circuit or a discrete thermistor, which is disposed on or near the block and thus is operative to sense the temperature of the block. A third analogue-to-digital converter 46 is operative to convert the analogue signal from the temperature sensor 44 to corresponding digital data. Temperature is measured to 0.5 degrees Centigrade.

Figure 3:
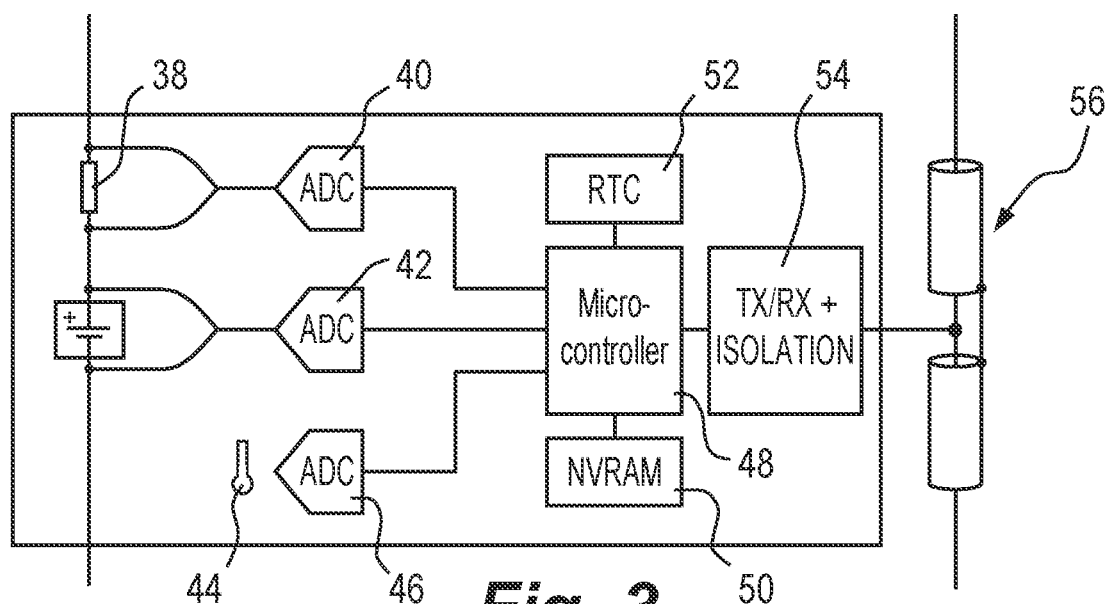
FIG. 3 is a block diagram representation of circuitry of the energy conversion arrangement which is located at a cell block.

The measurement and processing circuitry of FIG. 3 yet further comprises a microcontroller 48, non-volatile RAM 50, a Real Time Clock (RTC) 52 and transceiver circuitry 54. Components of the measurement and processing circuitry of FIG. 3 other than the microcontroller 48 are constituted as a custom integrated circuit with the measurement and processing circuitry being contained within or mounted on the block. The microcontroller 48 receives digital data from the first to third analogue-to-digital converters 40, 42, 46 corresponding to current, voltage and temperature and is operative to process the received data and to determine block conditions and electrical parameters as described below. As will become apparent from the following description condition determination involves comparison with threshold values. The measurement and processing circuitry of FIG. 3 therefore comprises a stable voltage reference, such as a band-gap reference, which is calibrated against a known voltage. The determined conditions and derived electrical parameters are stored in the non-volatile RAM 50 along with a time stamp from the RTC 52 whereby data is stored for the lifetime of the block. The measurement and processing circuitry of FIG. 3 is operative to measure the voltage, current and temperature at a rate between 0.01 Hz (i.e. less than once per minute) and 1 kHz depending on system activity. When there is no charging or discharging, measurement is at a very slow rate to minimise power consumption. On the other hand, measurement is at a higher rate when there is activity such as charging or discharging. The microcontroller 48 is operative to prioritise stored data and periodically deletes old data or data of less significance to thereby make efficient use of the non-volatile RAM 50. The RTC 52 is autonomous and is driven by either a quartz crystal oscillator or a timing signal from the microcontroller 48. Whatever long term drift may be present is addressed by periodically synchronising the RTC 52 to an external clock such as an Internet based clock service accessed by way of the vehicle charging point 16. The measurement and processing circuitry of FIG. 3 is operative to detect when no current is drawn by a block whereupon the measurement and processing circuitry enters a sleep state from which it awakes periodically to resume measurement.

Onward communication of data from the measurement and processing circuitry of FIG. 3 is by way of the transceiver circuitry 54 to a bus 56. The transceiver circuitry 54 is configured to provide galvanic isolation from the bus 56. Galvanic isolation is employed to address the cumulative voltage shift as the bus 56 traverses all the blocks in the battery. In a first form, the transceiver circuitry 54 is configured to communicate by way of the IEEE 802.15 Personal Area Network standard with data being conveyed by way of twisted-pair cable connected by a transformer (not shown) to each transceiver circuitry 54. In a second form, data is conveyed by way of the main electrical battery bus. The main electrical battery bus is normally noisy and therefore a robust protocol of a kind used in Power Line Communications (PLC) is employed in the second form instead of the IEEE 802.15 Personal Area Network standard.

Returning now to FIG. 2, a supervisory microcontroller 58 is connected to the bus 56. The supervisory microcontroller 58 is configured to perform supervisory operations in relation to the measurement and processing circuitry of FIG. 3 at its respective block of cells 30, 32, 34, 36. The supervisory microcontroller 58 is either one of the microcontrollers at a block of cells or a separate microcontroller. The supervisory microcontroller 58 is configured to provide for communication with an external network which is accessed when the Electric Vehicle 10 of FIG. 1 is connected to the vehicle charging point 16. Communication of data with the external network is by way of a wired channel or a wireless channel depending on whether charging is achieved by way of a wired approach or a wireless approach. As mentioned above with reference to FIG. 1 there is data communication between the vehicle charging point 16 and the server 18. The supervisory microcontroller 58 is configured to provide for communication with the external network in accordance with an Internet protocol such as TOP protocol over IPv6. Use of an Internet protocol provides for ease of communication of data between the supervisory microcontroller 58 and the server 18. The server 18 of FIG. 1 is operative to store data from a large number of BEVs over time with such stored data being of value to the like of cell and energy conversion arrangement manufacturers. The supervisory microcontroller 58 is further configured to cooperate with other on-board measurement and data recording apparatus whereby data from in-vehicle sensors and the like is received by the supervisory microcontroller 58 for onward communication to the server to provide for enhanced data recording. The supervisory microcontroller 58 is further configured to analyse recorded data and to compare an outcome of the analysis with reference data. The reference data is, for example, based on data recorded during at least one previous journey and the analysis comprises comparing efficiency of energy use between a presently completed journey and the reference data. By way of further example, the reference data may be based on data collected from several BEVs which is stored in the server 18 and subsequently communicated to the BEV which is making use of a facility to compare driving efficiency with the like of a mean standard established for a similar journey by a large number of other vehicles.

A unique address is stored in memory local to each microcontroller whereby each block can be uniquely identified. The unique address has a format in accordance with an Internet protocol such as TOP protocol over IPv6 to thereby provide for ease of communication of data by way of the bus 56 between each block and an Internet connected server 18.

Figure 4:
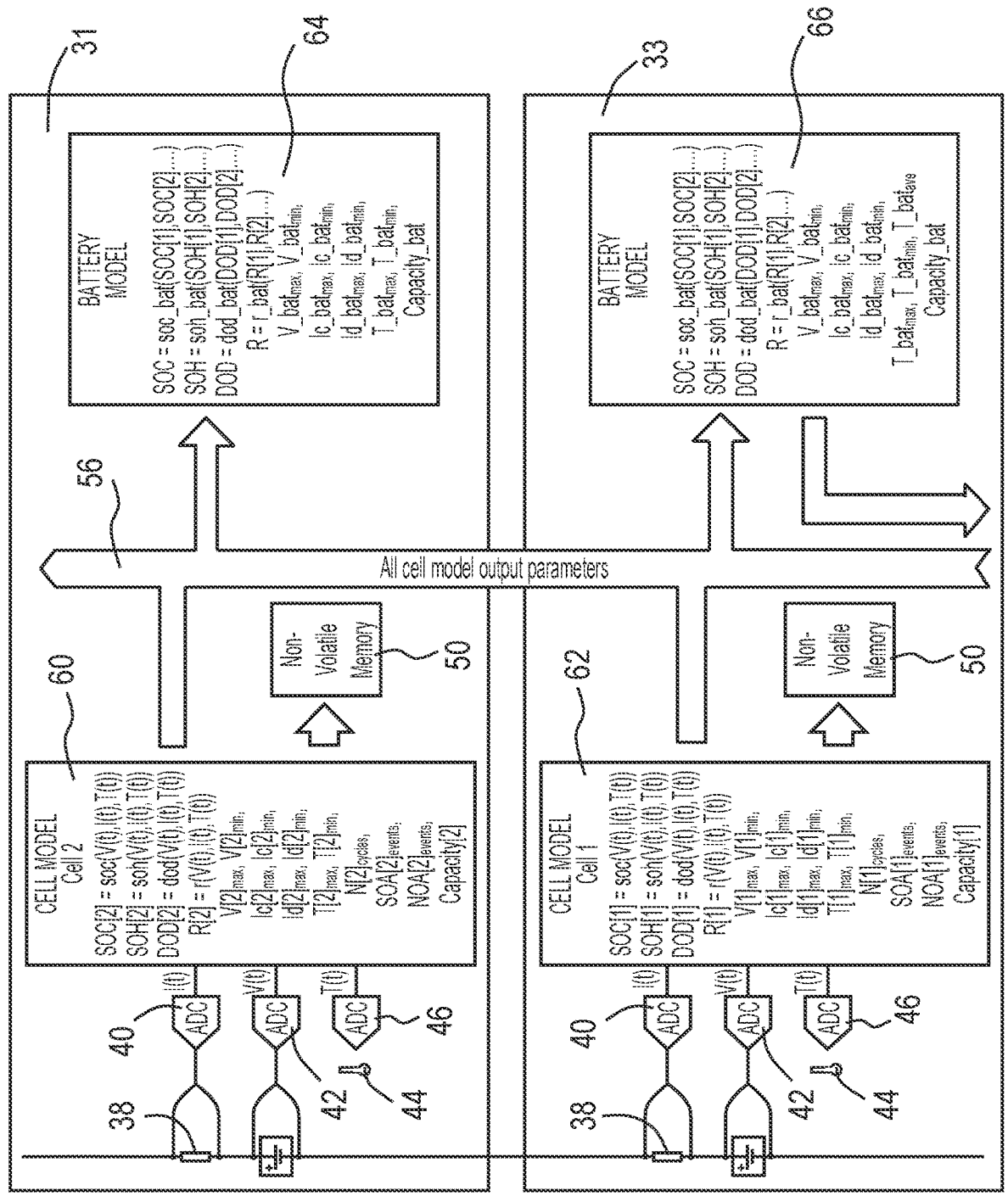
FIG. 4 is a block diagram representation showing cell group models and a battery model.

The processing of measurements within the first to fourth measurement and processing circuitry 31, 33, 35, 37 will now be considered in more detail with reference to FIG. 4. FIG. 4 is a block diagram representation of cell group models and a battery model. FIG. 4 shows the first and second measurement and processing circuitry 31, 33 for their respective blocks. Components in common with FIGS. 2 and 3 are indicated by like reference numerals. Also shown in FIG. 4 is a first cell group model 60, a second cell group model 62, a first battery model 64 and a second battery model 66. The first cell group model 60 is stored in memory local to a first microcontroller of the first measurement and processing circuitry 31 for one block and the second cell group model 62 is stored in memory local to a second microcontroller of the second measurement and processing circuitry 33 for the other block. The first battery model 64 is stored in memory local to the first microcontroller and the second battery model 66 is stored in memory local to the second microcontroller. There is therefore a cell group model and a battery model at each block of battery cells. The same battery model is present at each block of battery cells such that in the present example the second battery model 66 is a copy of the first battery model 64. As will become apparent from the following description, each battery model 64, 66 makes use of data produced by both of the cell group models 60, 62. Data from each cell group model 60, 62 is therefore conveyed by way of the bus 56 to both battery models 64, 66.

Operation of a cell group model will now be described. As described above voltage, current and temperature data is received by the microcontroller. The microcontroller is then operative to determine block conditions and derived electrical parameters in dependence on the measured voltage, current and temperature data with reference to a cell group model. More specifically block conditions and derived electrical parameters include the like of State of Charge (SOC), State of Health (SOH), Depth of Discharge (DOD), capacity, internal resistance and internal impedance. Block conditions further include events such as SOA and NOA infringements and charge/discharge cycles. An example of a model for a cell group or an individual battery cell which is employed in condition determination is provided below. Outputs from the cell group model are then conveyed to the battery model which is operative to determine the like of overall SOC, overall SOH, overall DOD, overall capacity, overall internal resistance and overall temperature for the battery in dependence on the outputs received from cell group models 60, 62. A microcontroller at a block is then further operative to act in dependence on the battery level determinations. As a consequence of the presence of a battery model in each of the first to fourth measurement and processing circuitry 31, 33, 35, 37, each block is capable of independent operation in respect of the battery as a whole. For example each microcontroller is operative to determine the requirement for and then to initiate and control a charge balancing operation.

Charge balancing is often an important function for an electric battery. As described above each cell group determines its own SOC and receives, amongst other things, SOC data for other cell groups comprised in the electric battery whereby an SOC for the battery as a whole is determined. The battery is configured such that each cell group is operative to determine whether or not the cell group should perform passive charge balancing in dependence on the cell group's own SOC and the SOC for the battery. Thus each cell group in the battery makes a determination in respect of charge balancing either independently of the other cell groups or in cooperation with the other cell groups. The battery further comprises charge balancing apparatus which is operative in dependence on a determination being made in respect of charge balancing. The form and function of appropriate charge balancing apparatus for use herein is described in *Battery Management Systems for Large Lithium-ion Battery Packs*, Davide Andrea, 2010, published by Artech House, Norwood MA 02062, USA.

A cell group or an individual battery cell is modelled by way of the following algorithm. The inputs to the algorithm are:

1. The nominal full cell capacity, CapCell.
2. The present cell Depth of Discharge (DOD) in Ah. If the cell is full then DOD 32 0. If the cell is empty then DOD=CapCell.
3. The nominal cell resistance, Rcell_nom,
4. The cell open circuit voltage (OCV) at four appropriate points in the State of Charge (SOC) versus OCV curve for the cell. For example, the four appropriate points are: the voltage at SOCempty 0% =Vempty; the voltage at SOCbottom 15% =Vbottom; the voltage at SOCtop 95% =Vtop; and the voltage at SOCfull 100% =Vfull. The OCV is the cell terminal voltage when no current is drawn and when the cell has had time to relax.

The algorithm has two independent loops, Loop 1 and Loop 2.

Loop 1:
When the drawn current changes, calculate the cell resistance, Rcell, on the basis of Rcell=(V1−V2)/(I2 −I1), where V1 and I1 are the voltage and current measured before the current change and V2 and I2 are the voltage and current measured after the current change.

The instantaneous OCV is determined by OCV=Vterm+Icell*Rcell, where Vterm is the measured instantaneous terminal voltage and cell is the measured instantaneous current.

Loop 2:
IF charging (i.e. current, I<0) THEN
    Calculate OCV=Vterm+Icell*Rcell
    IF OCV<Vtop THEN
        Integrate cell current, Icell, into the DOD
        Convert DOD to SOC by way of SOC=100%−100*DOD/CapCell
        IF SOC>SOCtop THEN
            Set SOC=SOCtop
            Convert SOC to DOD by way of DOD=Capcell*(100%−SOC)
    ELSE
        Convert OCV to SOC using a straight line interpolation between SOCtop and SOCfull and between Vtop and Vfull
        Convert SOC to DOD
IF discharging (current, I,>0) THEN
    IF OCV>Vbottom THEN
        Integrate cell current into DOD
        Convert DOD to SOC
        IF SOC<SOCbottom THEN Set SOC=SOCbottom
    Convert SOC to DOD
  ELSE
    Convert OCV to SOC using a straight line interpolation between SOCbottom and SOCempty and between Vbottom and Vempty
    Convert SOC to DOD The above algorithm is given by way of example only. During use of the algorithm there is an accumulation of errors on account of integration of measured current to determine the DOD whereby the DOD measurement uncertainty normally increases over time. The algorithm therefore involves a reset of the DOD when the SOC goes through either SOCtop or SOCbottom which can result in a significant jump in the measured SOC and DOD.

A battery is modelled by way of algorithms that provide for the like of the summing of individual cell block conditions, derived electrical parameters and measurements and the determination of derived quantities such a mean or average based on summed quantities.

The cell group model described above is based on the State of Charge (SOC) versus open circuit voltage (OCV) curve for the cell block. The cell group model for each cell block is configured and calibrated by taking the cell block through at least one complete charge and discharge cycle. During the at least one complete cycle voltage, current, temperature and time are measured to high accuracy and the measured values are used to configure and calibrate the cell group model. Each cell group model is therefore configured specifically for a particular cell block, Normally the cell group model calibration is performed at the same time as calibration of the rest of the battery management system to thereby provide a simpler calibration procedure and otherwise avoid duplication of cell group model calibration operations and battery management system calibration operations.

Figure 5:
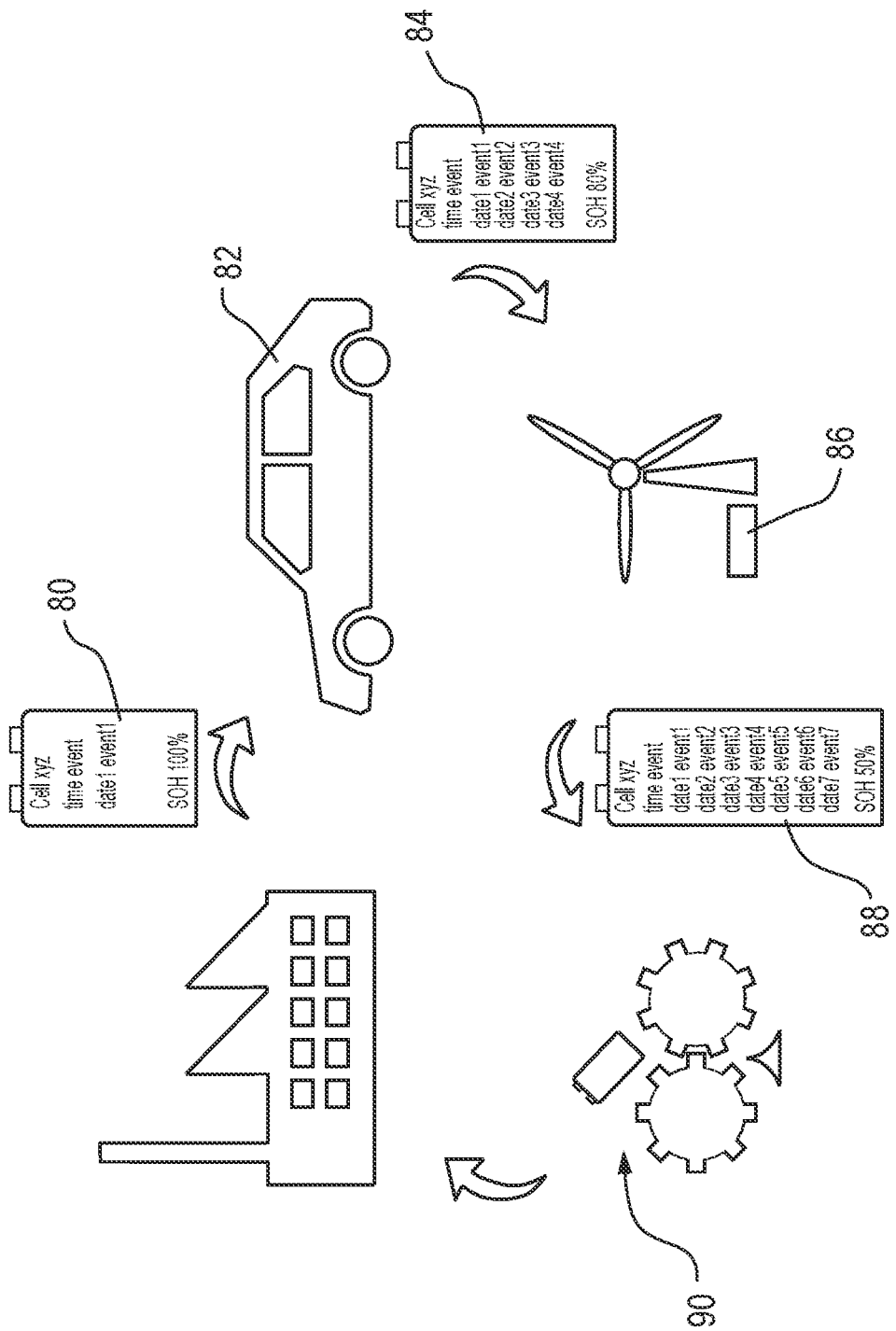
FIG. 5 illustrates a cycle of use of a battery cell.

A cycle of use of a battery cell is shown in FIG. 5. Upon manufacture the cell 80 has an SOH of 100% and is installed in an electric battery of a BEV 82. After a period of use in the BEV 82, the SOH of the cell as determined by the present invention drops to 80% which is a critical threshold for continued use in the BEV 82. Following identification of cell weakness by the present invention, the cell is removed from the BEV and installed in local electric battery storage 86 in an off-grid environment. The local electric battery storage 86 is configured in accordance with the present invention whereby monitoring of the cell is continued. When the SOH of the cell 88 as determined by the present invention drops to 50% which is a critical threshold for continued use in the local electric battery storage 86, the cell is removed from the local electric battery storage 86 and decommissioned 90.

It is to be noted that each cell group is operative of itself in respect of management functions such as: measurement of the like of voltage, current and temperature; determination of various parameters such as SOC, DOD, SOH and internal resistance; and the recordal of events such as charge/discharge cycles, NOA and SOA excursions. Each cell group is so operative irrespective of whether the battery has yet to be assembled from the cell group and other cell groups, the battery has been assembled or the battery has been disassembled such the cell group no longer forms part of the battery. Each cell group is therefore configured to perform the above described management functions. Furthermore each cell group is configured to perform the above described management functions in cooperation with at least one other cell group.

The present invention is also of application in Hybrid Electric Vehicles (HEVs), Plug-in Hybrid Electric Vehicles (PHEVs) and fuel cell electric vehicles (FCEVs). Where the present invention is applied to an FCEV, modifications are made to the cell/cell group model to take account of the different characteristics of fuel cells. Nevertheless models of the fuel cells comprised in the FCEV are determined in the same fashion as described above with reference to battery cells by way of measurements at each fuel cell during an initial calibration procedure. Furthermore the nature of the condition data determined for the fuel cells is selected to cater for the different characteristics of fuel cells. Otherwise the invention is of a form and function as described above with reference to BEVs.

The invention claimed is:

1. An electric battery, comprising:
   a plurality of cell groups, each cell group configured to convert chemical energy into electrical energy;
   each cell group of the plurality of cell groups comprising:
     circuitry located at the cell group and configured to take measurements at the cell group, the circuitry comprising memory associated with the cell group; and
     a cell group model calibrated for the cell group and stored in the memory associated with the cell group;
   wherein the circuitry is configured to:
     determine operational conditions of the cell group at spaced apart times, based on the measurements taken at the spaced apart times at the cell group and based on the cell group model; and
     store the determined operational conditions in the memory of the cell group, wherein the memory is configured to provide for storage by the circuitry of the determined operational conditions irrespective of whether a battery management system for managing the electric battery is powered up;
   wherein the circuitry is further configured to determine an electrical energy delivery capacity of the cell group based on the stored operational conditions to enable determination, based on the determined electrical energy delivery capacity and by evaluating a service history of the cell group based on the operational conditions stored in the memory associated with the cell group, of whether the cell group meets requirements of a second use application.

2. The electric battery of claim 1, wherein whether the cell group meets the requirements of the second use application is determined by comparing the determined electrical energy delivery capacity with a predetermined value defining an electrical energy delivery capacity requirement for the second use.

3. The electric battery of claim 1, wherein whether the cell group meets the requirements of the second use application is determined upon determining that the cell group is not useable to power an electric vehicle, by comparing the determined electrical energy delivery capacity with a predetermined value defining a minimum electrical energy delivery capacity requirement for powering the electric vehicle.

4. The electric battery according to claim 1, wherein the operational conditions comprise at least one of: State of Charge (SOC), State of Health (SOH), Depth of Discharge (DOD), capacity, internal resistance, internal impedance, a number of complete charge/discharge cycle, temperature, or total coulomb transfer.

5. The electric battery according to claim 1, wherein determining whether the cell group meets the requirements of the second use application comprises determining a degradation of the cell group or the electric battery based on the operational conditions stored in the memory associated with the cell group.

6. The electric battery according to claim 1, wherein the cell group model of each cell group comprises an identification code unique to each cell group, and the electric battery is configured to provide for addressability of each of the plurality of cell groups based on the respective identification code.

7. The electric battery according claim 1, further comprising a communications network, wherein each cell group is configured to communicate via the communications network, the communications network being configured to maintain electrical isolation between the plurality of cell groups.

8. The electric battery according to claim 1, wherein the plurality of cell groups is connected in series and wherein each cell group comprises: a cell, or a plurality of cells connected in parallel.

9. The electric battery of claim 1, wherein the second use application is a storage for an off-grid application including at least one of: wind, solar, or a combined heat and power (CHP) generation plant.

10. The electric battery according to claim 1, wherein the measurements taken at the cell group comprise one or more of physical properties of the cell group or electrical properties of the cell group.

11. The electric battery according to claim 10, wherein the measurements comprise at least one of: voltage, current, temperature, strain, vibration, or pressure.

12. The electric battery according to claim 11, wherein each cell group model is configured to characterize State of Charge (SOC) as a function of the open circuit voltage curve for the cell group, and wherein the operational conditions comprise at least one of the SOC or Depth of Discharge (DOD).

13. An electric battery, comprising:
a plurality of cell groups, each cell group configured to convert chemical energy into electrical energy;
each cell group of the plurality of cell groups comprising:
circuitry located at the cell group and configured to take measurements at the cell group, the circuitry comprising memory associated with the cell group; and
a cell group model calibrated for the cell group and stored in the memory associated with the cell group;
wherein the circuitry is configured to:
determine operational conditions of the cell group at spaced apart times, based on the measurements taken at the spaced apart times at the cell group and based on the cell group model;
store the determined operational conditions in the memory of the cell group, wherein the memory is configured to provide for storage by the circuitry of the determined operational conditions irrespective of whether a battery management system for managing the electric battery is powered up;
wherein the circuitry of at least one cell group is further configured to determine an electrical energy delivery capacity of the electric battery based on the operational conditions determined for the plurality of cell groups to enable determination, based on the determined electrical energy delivery capacity and by evaluating a service history of the cell group based on the operational conditions stored in the memory associated with the cell group, whether the electric battery meets requirements of a second use application.

14. The electric battery according claim 13, further comprising a communications network, wherein each cell group is configured to communicate via the communications network, the communications network being configured to maintain electrical isolation between the plurality of cell groups.

15. The electric battery of claim 13, wherein the second use application is a storage for an off-grid application including at least one of: wind, solar, or a combined heat and power (CHP) generation plant.

16. The electric battery according to claim 13, wherein the measurements taken at the cell group comprise one or more of physical properties of the cell group or electrical properties of the cell group.

17. The electric battery according to claim 13, configured to determine an operational condition of the electric battery as a whole, based on the operational conditions determined for the plurality of cell groups.

18. The electric battery according to claim 17, wherein the electrical energy delivery capacity of the electric battery is determined based on the operational conditions of the electric battery determined at spaced apart times.

19. The electric battery according to claim 17, further comprising an electric battery model configured to receive operational conditions of the plurality of cell groups and output electric battery data based thereon, wherein the operational condition of the electric battery as a whole is determined based on the electric battery data.

20. The electric battery according to claim 19, wherein the electric battery model is stored at each of the plurality of cell groups in the memory associated with the cell group.

* * * * *